(12) United States Patent
Tanaka

(10) Patent No.: US 6,412,408 B1
(45) Date of Patent: Jul. 2, 2002

(54) SIMPLIFIED SCREEN PRINTING MACHINE HAVING PRESSING MEMBER

(75) Inventor: Toshio Tanaka, Ibaraki-ken (JP)

(73) Assignee: Riso Kagaku Corporation, Tokyo (JP)

(*) Notice: Subject to any disclaimer, the term of this patent is extended or adjusted under 35 U.S.C. 154(b) by 0 days.

(21) Appl. No.: 09/688,336

(22) Filed: Oct. 16, 2000

(30) Foreign Application Priority Data

Oct. 18, 1999 (JP) .......................................... 11-295241

(51) Int. Cl.⁷ .......................... B41L 13/02; B41F 15/14
(52) U.S. Cl. ............... 101/126; 101/128.21; 101/128.4; 101/127.1
(58) Field of Search ................................. 101/114, 123, 101/126, 127, 127.1, 128.1, 128.21, 128.4, 129

(56) References Cited

U.S. PATENT DOCUMENTS

| 538,066 A | * | 4/1895 | Condé ..................... 101/128.4 |
| 1,495,037 A | | 5/1924 | Patterson |
| 2,747,505 A | | 5/1956 | Bailey ........................ 101/287 |
| 3,964,385 A | * | 6/1976 | Knight ..................... 101/128.4 |
| 4,184,428 A | * | 1/1980 | Hosoya .................... 101/128.4 |
| 4,381,706 A | | 5/1983 | Harpold .................... 101/127.1 |
| 4,896,597 A | * | 1/1990 | Hayata et al. .............. 101/126 |
| 5,172,633 A | * | 12/1992 | Hung ....................... 101/128.4 |
| 5,355,791 A | | 10/1994 | Benedetto et al. .......... 101/126 |
| 5,720,220 A | * | 2/1998 | Kodama et al. ......... 101/127.1 |
| 5,781,694 A | * | 7/1998 | Kikuchi et al. ............. 101/470 |

FOREIGN PATENT DOCUMENTS

| DE | 30 20 477 | 12/1980 |
| EP | 0 588 580 | 3/1994 |

* cited by examiner

*Primary Examiner*—Leslie J. Evanisko
(74) *Attorney, Agent, or Firm*—Kanesaka & Takeuchi

(57) ABSTRACT

A simplified screen printing machine includes a base member having a print base with an elastic member for mounting an object to be pressed; a framed stencil sheet assembly including a stencil sheet formed of a porous support and a resin film laminated to the support and a frame member laminated with the stencil sheet; and a pressing device attachably and detachably assembled with the framed stencil sheet assembly for pressing the framed stencil sheet assembly to the base member. The pressing device has an opening for receiving at least a part of the print base therein. When the pressing device with the stencil sheet assembly is disposed on the print base with the object, the print base is at least partly located in the opening to thereby stretch the framed stencil sheet assembly with tension.

8 Claims, 15 Drawing Sheets

FIG.6
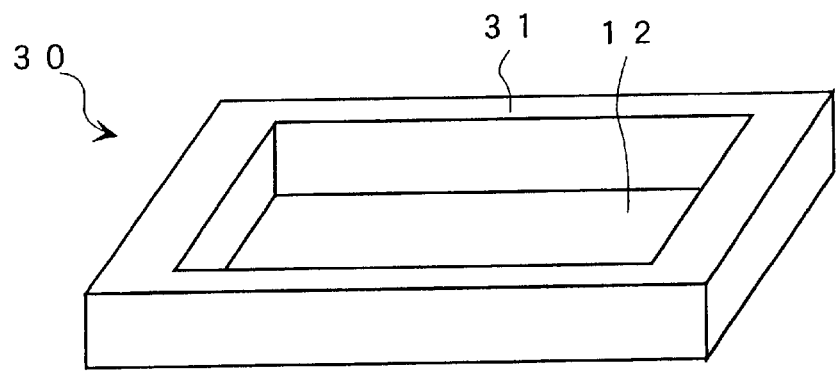
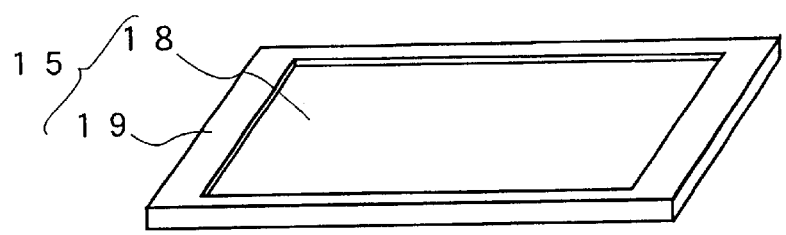
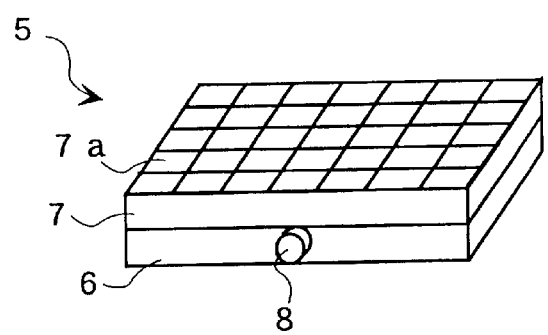
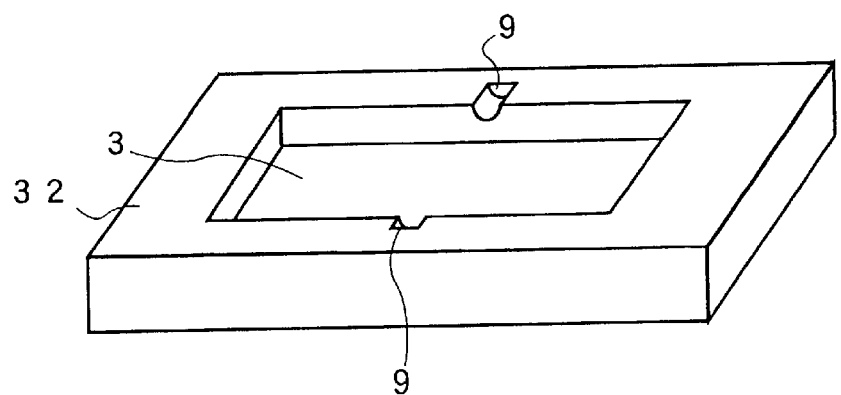

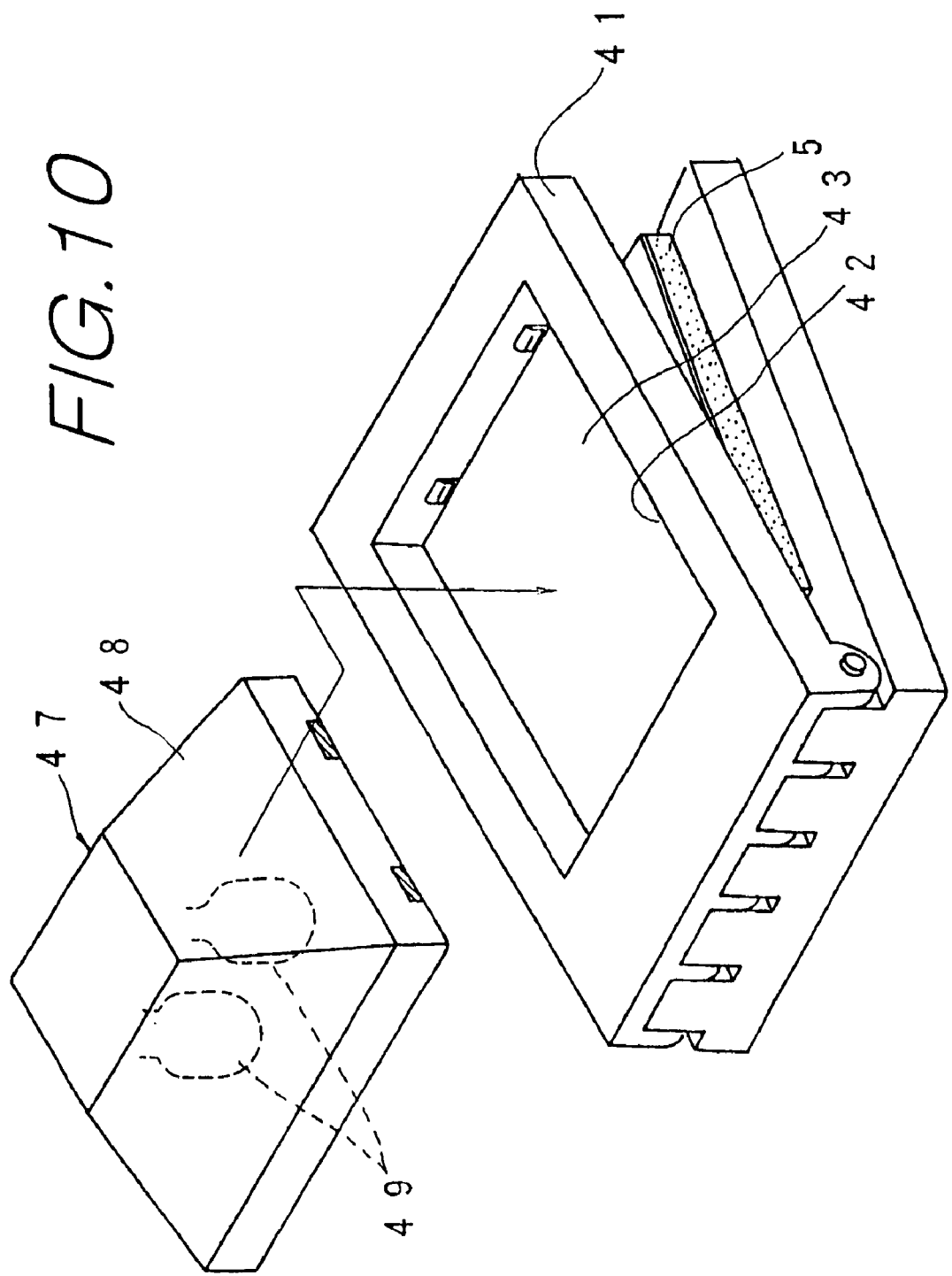

SIMPLIFIED SCREEN PRINTING MACHINE HAVING PRESSING MEMBER

BACKGROUND OF THE INVENTION

1. Field of the Invention

The present invention relates to a simplified type screen printing machine for printing an object to be pressed mounted on a print base by using a framed stencil sheet assembly, particularly to a simplified type screen printing machine for easily exerting tension to a framed stencil sheet assembly and providing distinct picture.

2. Description of the Related Art

Screen printing method is suitable for a print face, the surface of which is smooth and which is difficult to absorb ink. According to the screen printing method, as is well known, there is used a screen 53 laminated together with a thermoplastic resin film 52 and a porous support 51 as shown by FIGS. 12(a), 12(b), 12(c) and 12(d). The screen 53 is perforated and four peripheries thereof are fixed to a plate frame 54 with tension.

As shown by FIG. 12(a), the screen 53 is opposed to a print base member 56 on which an object to be printed 55 is mounted to be spaced apart therefrom by a predetermined interval and is fixed thereto by predetermined tension. Further, when as shown by FIG. 12(b), screen printing ink 57 is placed on the screen 53 and while pressing a surface of the screen 53 (porous support 52) by a squeegee 58, a rear face of the screen 53 (thermoplastic resin film 51) is brought into contact with the object to be printed 55 and squeegeed, as shown by FIG. 12(c), the ink 57 passes through opening portions of the plate where the thermoplastic resin film 51 is not present from the porous support 52 and is extruded onto the object to be printed 55. When the squeegee operation is finished, as shown by FIG. 12(d), the screen 53 is recovered to an original state by tension of the screen 53.

However, according to the above-described printing, the screen 53 needs to fix with tension by being floated up from the print face of the object to be printed 55 by the predetermined interval. Further, the squeegee 58 is partially depressed onto the screen 53 fixed with tension and therefore, adjustment of force exerted on the squeegee 58 is difficult and differs by operators. Therefore, considerable skill is needed for uniformly squeegeeing the surface of the screen 53 by pertinent depressing force. Further, some degree of rigidity is needed for the plate frame 54 and therefore, it is difficult to use a frame member having weak rigidity such as a frame member made of paper.

The present invention has been carried out in order to remove the above-described drawback and it is an object thereof to exert predetermined tension to a framed stencil sheet assembly over an entire face of an object to be pressed by pressing the stencil sheet assembly to a base member to be brought into contact with the object to be pressed and fixing the framed stencil sheet assembly with tension.

Further, it is other object thereof to make a image forming material pass through a framed stencil sheet assembly by image forming means in a state of exerting predetermined tension to the framed stencil sheet assembly to thereby form image having a uniform distinctness over an entire face of an object to be pressed constituting an object to be pressed even when pressure applied on the framed stencil sheet assembly by the image forming means is not uniform.

It is still other object thereof to form perforations which have a uniform distinctness by uniformly irradiating light over an entire face of the draft constituting an object to be pressed by providing attachably and detachably a light irradiating apparatus for irradiating light to perforate a framed stencil sheet.

Further, it is other object thereof to make the uniform tension of a framed stencil sheet assembly by relievably fixing pressing means to a base member in a state in which the framed stencil sheet assembly is fixed with tension to an object to be pressed on a base member. Particularly, it is the object of the present invention to provide further distinct perforations in perforating operation and to provide further distinct image in printing operation.

It is still other object thereof to carry out screen printing and plane press type printing by a single printing machine by interchangeably constituting pressing means and pressing means with transparent plate provided with a transparent plate at an opening portion.

SUMMARY OF THE INVENTION

According to a first aspect of the present invention, there is provided a simplified type screen printing machine comprising a base member on which an object to be pressed is mounted, a framed stencil sheet assembly at least constituted by stencil sheet comprising a porous support and a resin film laminated to the support and a frame member laminated with the stencil sheet, and pressing means attachably and detachably attached with the framed stencil sheet assembly for pressing the framed stencil sheet assembly to the base member to be brought into contact with the object to be pressed to fix the framed stencil sheet assembly.

Further, according to a second aspect of the present invention, there is provided the simplified type screen printing machine according to the first aspect wherein an object to be printed is mounted as the object to be pressed, further comprising image forming means for making an image forming material pass through the framed stencil sheet assembly which is fixed with tension.

Further, according to a third aspect of the present invention, there is provided the simplified type screen printing machine according to the first aspect wherein an original for perforating the framed stencil sheet assembly is mounted as the object to be pressed, further comprising a light irradiating apparatus attachably and detachably mounted to the pressing means for irradiating light to the stencil sheet of the framed stencil sheet assembly which is fixed with tension.

Further, according to a fourth aspect of the present invention, there is provided the simplified type screen printing machine according to any one of the first through the third aspects wherein the pressing means is provided with an opening portion openably and closably supported axially by the base member and attachably and detachably attached with the framed stencil sheet assembly.

Further, according to a fifth aspect of the present invention, there is provided the simplified type screen printing machine according to any one of the first through the third aspects wherein the pressing means is provided to the base member as a separate member and provided with an opening portion attachably and detachably attached with the framed stencil sheet assembly.

Further, according to a sixth aspect of the present invention, there is provided the simplified type screen printing machine according to anyone of the fourth or the fifth aspect, further comprising a print base comprising an elastic member for mounting the object to be pressed provided on an upper face of the base member, and wherein at least a portion of the print base is disposed at inside of the opening portion when the framed stencil sheet assembly is fixed to the object to be pressed on the base member by predetermined tension.

Further, according to a seventh aspect of the present invention, there is provided the simplified type screen printing machine according to anyone of the first through the sixth aspects, further comprising fixing means for relievably fixing the pressing means to the base member in a state in which the framed stencil sheet assembly is fixed to the object to be pressed on the base member tense by the predetermined tension.

Further, according to an eighth aspect of the present invention, there is provided the simplified type screen printing machine according to any one of the first through the seventh aspects wherein the pressing means can be interchanged with pressing means having a transparent plate provided with the transparent plate at the opening portion and wherein the stencil sheet assembly is further provided with an ink-unpermeable back sheet pasted at the frame member.

In perforating operation, firstly, the light irradiating apparatus is mounted to the opening portion of the pressing means. The pressing means is pressed to the base member, the framed stencil sheet assembly is brought into contact with an original and the framed stencil sheet assembly is fixed with tension. At this occasion, at least a portion of the print base provided at the base member is disposed at inside of the opening portion of the pressing means. Further, a pivotal end of the pressing means and the base member are brought into contact with each other, electricity is conducted to the light irradiating apparatus and light is irradiated to the stencil sheet of the framed stencil sheet assembly which has been fixed with tension. The stencil sheet is formed with desired perforated image in accordance with an original image.

In printing operation, the light irradiating apparatus is removed. The pressing means is pressed to the base member, the framed stencil sheet assembly which has been perforated is brought into contact with an object to be printed and the framed stencil sheet assembly is fixed with tension. At this occasion, at least a portion of the print base provided at the base member is disposed at inside of the opening portion of the pressing means. From this state, the image forming material is made to pass through the perforated stencil sheet by the image forming means. The image forming material which has passed therethrough reaches the object to be printed and desired image is formed.

BRIEF DESCRIPTION OF THE DRAWINGS

FIG. 6 is a disassembled perspective view of a simplified type screen printing machine according to a second embodiment;

FIG. 10 is an outline view of a simplified type screen printing machine provided with a press plate having a transparent plate;

DETAILED DESCRIPTION OF THE PREFERRED EMBODIMENTS

Figure 1:
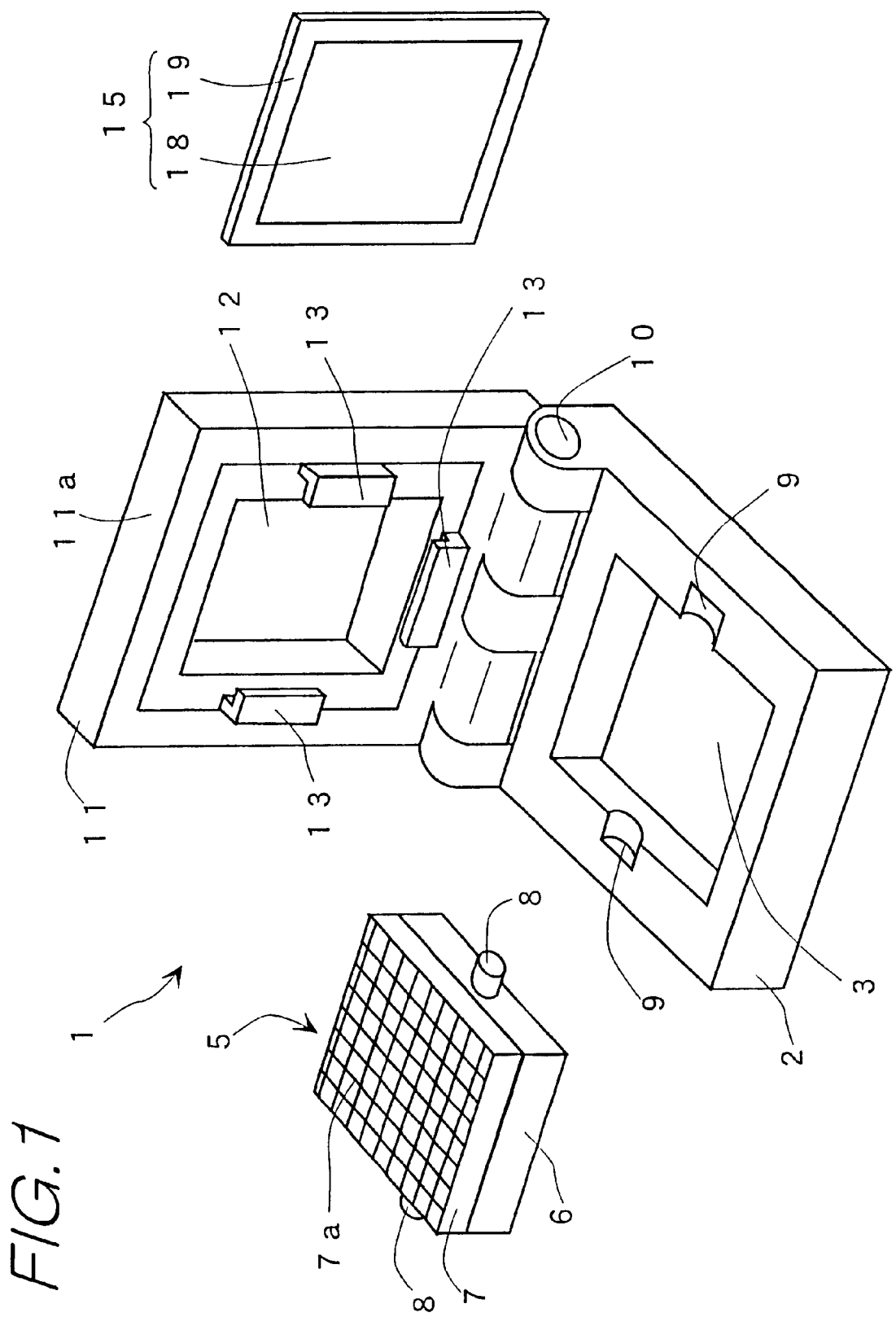
FIG. 1 is a disassembled perspective view of a simplified type screen printing machine according to a first embodiment.
Figure 2:
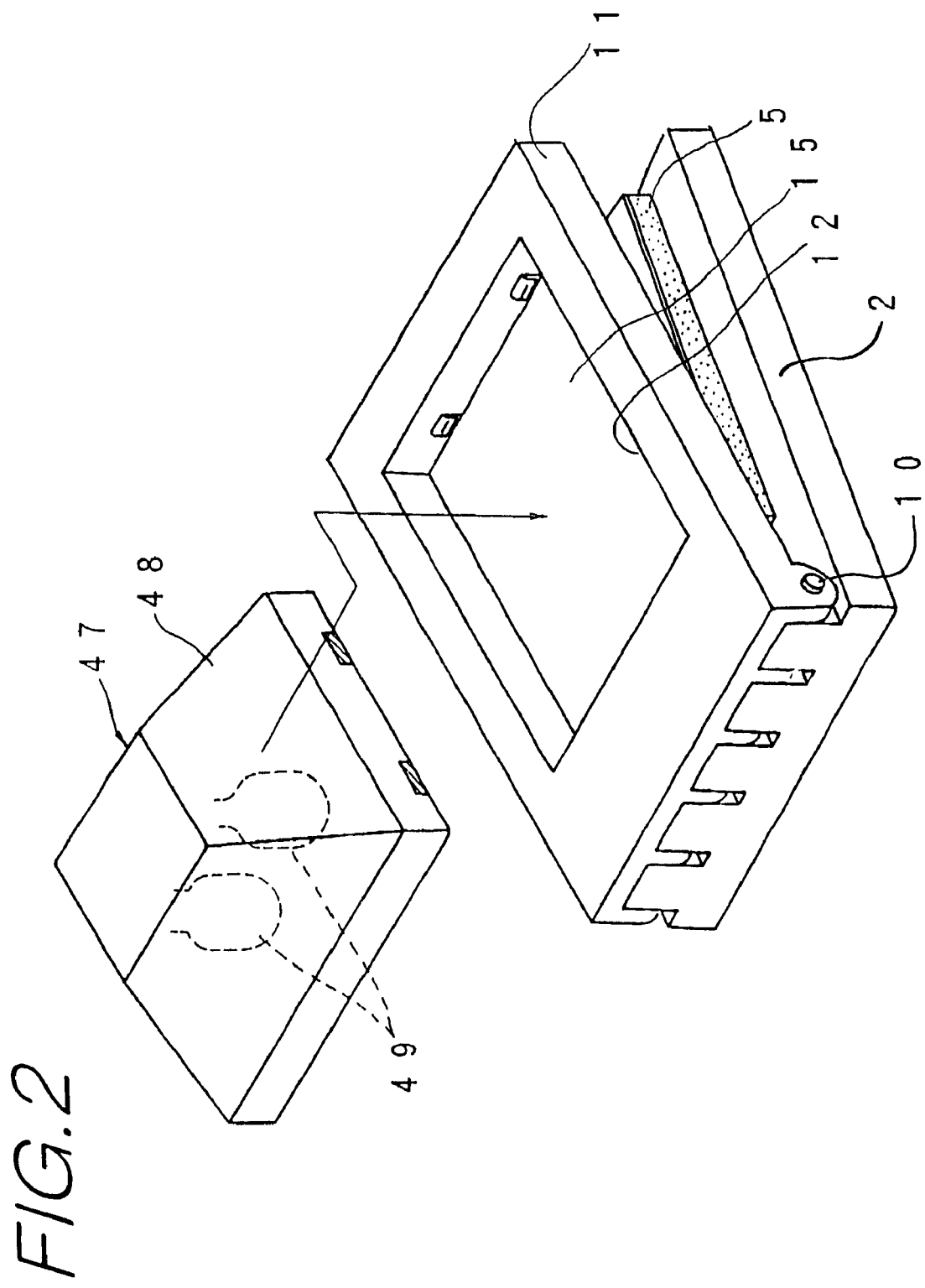
FIG. 2 is a view showing the simplified type screen printing machine according to the first embodiment and a light irradiating apparatus.

As shown by FIG. 1 and FIG. 2, a simplified type screen printing machine 1 according to an embodiment is generally constituted by a base member 2, a press plate 11 constituting pressing means and a framed stencil sheet assembly 15.

As shown by FIG. 1, a recess portion 3 in a rectangular shape is formed at an upper face of the base member 2. In the recess portion 3, a print base 5 for mounting an object to be pressed such as an object to be printed (for example, a printing paper) or an original is axially supported pivotably within a predetermined angular range. The print base 5 is constituted by a base plate 6 axially supported by the recess portion 3 of the base member 2 and an elastic pad 7 provided on the base plate 6. Pivot shafts 8 are projected from left and right end faces of the base plate 6 and are pivotably engaged with bearings 9 formed with the recess portion 3. The pad 7 is formed by soft polyurethane foam and is provided with a property in which a pressure state thereof stays substantially constant when an amount of displacement thereof falls in a predetermined range.

At one end portion of the base member 2, there is provided a pivotal shaft 10 to which the press plate 11 is pivotably attached. The press plate 11 is provided with an opening portion 12. The opening portion 12 is formed slightly larger than a mounting face (surface of pad 7) 7a of the print base 5 on which an object to be pressed such as a printing paper or an original, not illustrated, is mounted and when the press plate 11 is pressed in a direction of the print base 5, the mounting face is disposed at inside of the opening portion 12. On a side of a face of the press plate 11 opposed to the base member 2, there are provided holding members 13 to which the framed stencil sheet assembly 15 is fitted.

As shown by FIG. 2, a light irradiating apparatus 47 is provided attachably and detachably to and from the opening portion 12 of the press plate 11. The light irradiating apparatus 47 is provided with a cabinet 48 substantially in a shape of a quadrangular prism and flash bulbs 49 as light emitting means at inside thereof. Further, a reflecting mirror, not illustrated, is provided at an inner face of the cabinet 48.

Figure 3A:
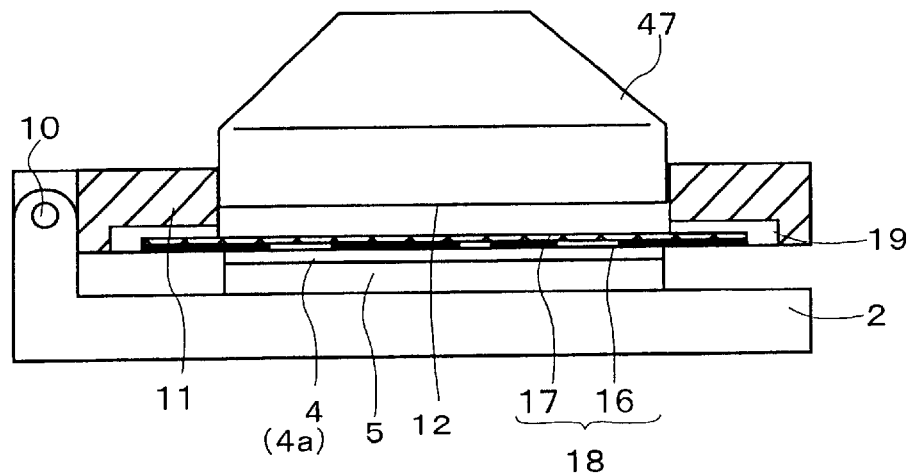
FIG. 3(a) is a side sectional view showing a state before pressing in a perforating stage of the simplified type screen printing machine according to the first embodiment.
Figure 3B:
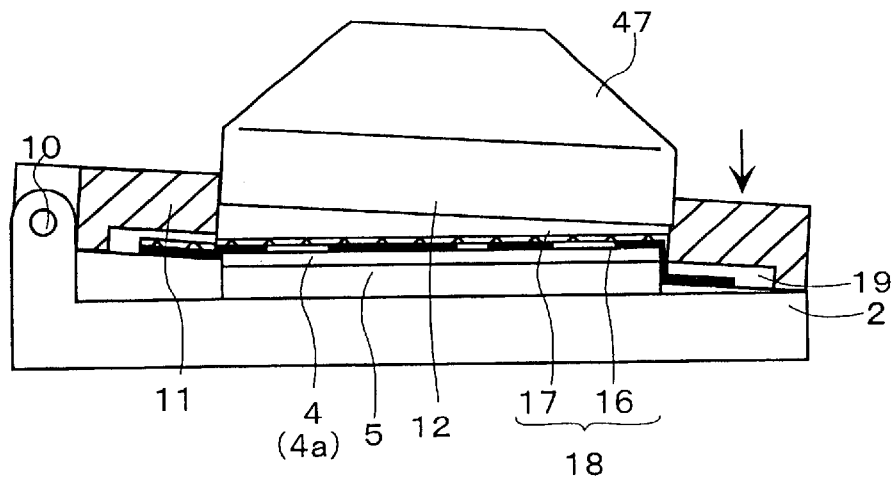
FIG. 3(b) is a side sectional view showing a state of pressing in the perforating stage of the simplified type screen printing machine according to the first embodiment.

As shown by FIGS. 3(a) and 3(b), the framed stencil sheet assembly 15 is constituted by a heat-sensitive framed stencil sheet 18 constituted by laminating together a thermoplastic resin film 16 such as a plastic film and a porous support 17 in a mesh-like shape and a frame member 19 made of paper, wood or aluminum for fixing four peripheries of the stencil sheet 18. In this case, the frame member 19 for supporting the stencil sheet 18 is fitted to the holding members 13 provided on the side of the base member 2 of the press plate 11.

Further, the base member 2 is built with a power source, not illustrated, which is conducted to the light irradiating apparatus 47 mounted to the opening portion 12 by being brought into contact with a pivotal end of the press plate 11.

Next, an explanation will be given of operation of the embodiment in reference to FIGS., 3(a) and 3(b) and FIGS. 4(a), 4(b), 4(c) and 4(d). As shown by FIG. 3(a), firstly, the light irradiating apparatus 47 is mounted to the opening portion 12 of the press plate 11. The framed stencil sheet assembly 15 is fitted to the holding members 13 of the press plate 11. Further, an original 4a as an object to be pressed 4 is mounted on the pad 7. The press plate 11 is pivoted toward the print base 5 and the framed stencil sheet assembly 15 is brought into close contact with the surface of the original 4a on the pad 7.

Further, when the press plate 11 is pressed as shown by FIG. 3(b), the framed stencil sheet assembly 15 is pressed by the print base 5 from a side with which the an original 4a is brought into close contact and is fixed by predetermined tension. At this occasion, a portion of the print base 5 mounted with the original 4a is disposed at inside of the opening portion 12 of the press plate 11.

Further, the pivotal end of the press plate 11 and the base member 2 are brought into contact with each other to thereby conduct electricity to the light irradiating apparatus 47, light is irradiated to the stencil sheet 18 of the framed stencil sheet assembly 15 which is fixed with tension and image of the original 4a generates heat. The thermoplastic resin film 16 of the stencil sheet 18 is formed with desired perforated image in accordance with the original image.

Figure 4A:
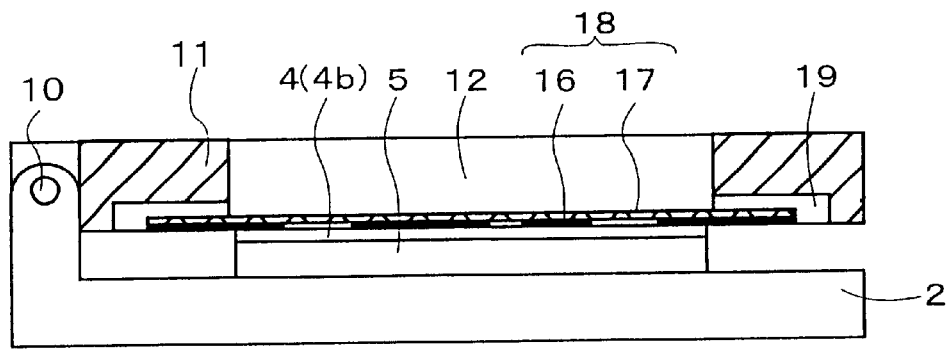
FIG. 4(a) is a side sectional view showing a state before pressing in a printing stage of the simplified type screen printing machine according to the first embodiment.

Next, in printing operation, the light irradiating apparatus 47 is firstly removed. Further, as shown by FIG. 4(a), a printing paper 4b as the object to be pressed 4 is mounted on the print base 5. The press plate 11 is pivoted toward the print base 5 and the framed stencil sheet assembly 15 is brought into close contact with the surface of the printing paper 4b on the print base 5.

Figure 4B:
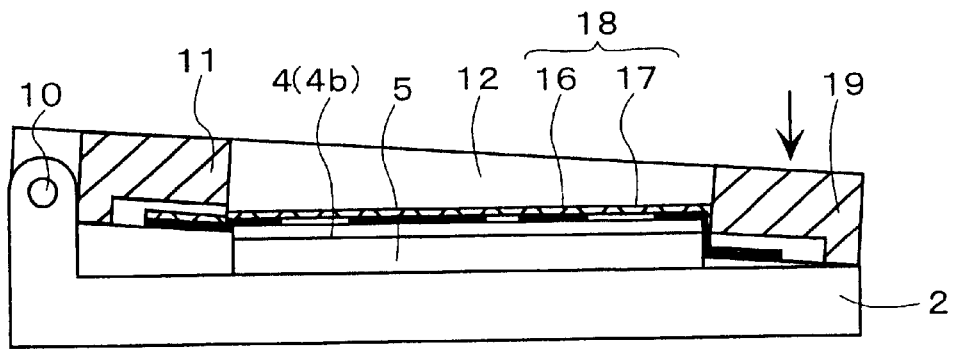
FIG. 4(b) is a side sectional view showing a state of pressing in the printing stage of the simplified type screen printing machine according to the first embodiment.
Figure 4C:
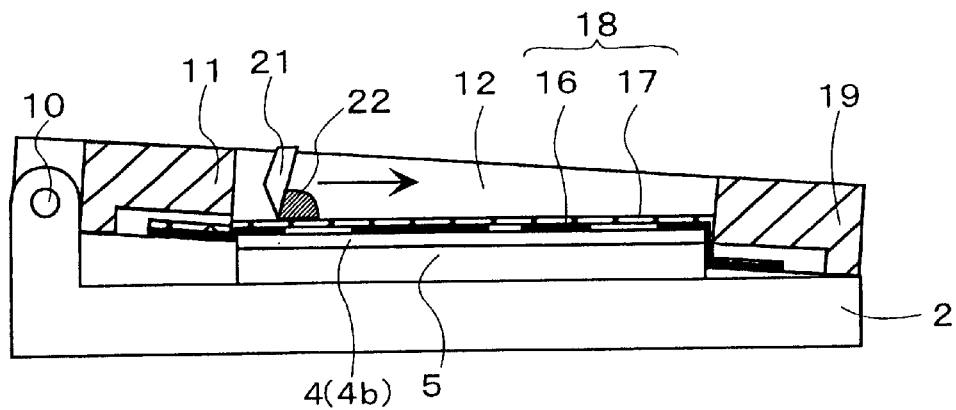
FIG. 4(c) is a side sectional view showing a state in squeegeeing in the printing stage of the simplified type screen printing machine according to the first embodiment.
Figure 4D:
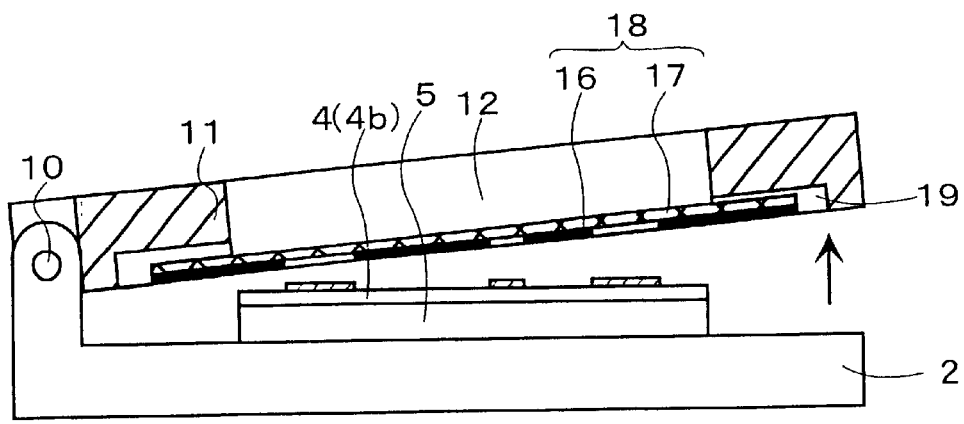
FIG. 4(d) is a side sectional view showing a state in taking out an object to be printed in the printing stage of the simplified type screen printing machine according to the first embodiment.

Further, when the press plate 11 is pressed as shown by FIG. 4(b), the framed stencil sheet assembly 15 is pressed by the print base 5 from a side thereof with which the printing paper 4b is brought into close contact and is fixed by predetermined tension. At this occasion, a portion of the print base 5 mounted with the printing paper 4b is disposed at inside of the opening portion 12 of the press plate 11. Under the state, as shown by FIG. 4(c), the framed stencil sheet assembly 15 is squeegeed by a squeegee 21 constituting image forming means from a side of the porous support 17. Screen printing ink 22 constituting an image forming material passes from the porous support 17 to the side of the resin film 16 and is printed on a printed face of the printing paper 4b. Further, as shown by FIG. 4(d), the press plate 11 is pushed up and the printing paper 4b which has been printed is taken out.

Therefore, according to the simplified type screen printing machine 1 constituted in this way, the predetermined tension can simply be exerted to the framed stencil sheet assembly 15 even by manual operation and distinct image can be provided over the entire printed face of the printing paper 4beven when force exerted to the squeegee 21 is not uniform.

Figure 5A:
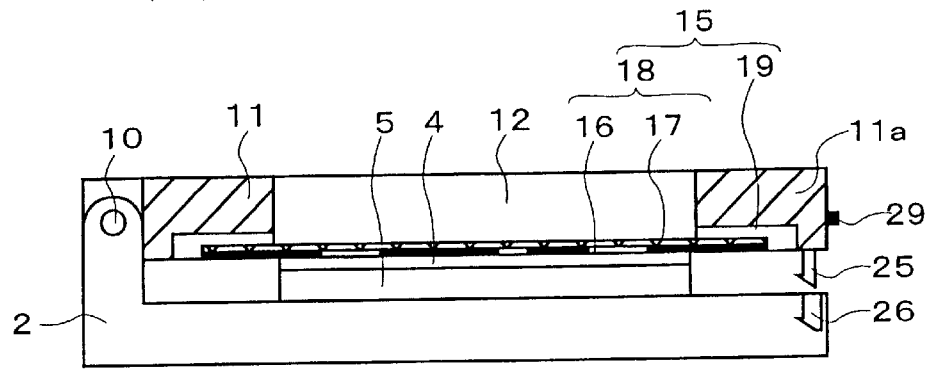
FIG. 5(a) is a side sectional view showing a state before pressing when fixing means is provided to the simplified type screen printing machine according to the first embodiment.
Figure 5B:
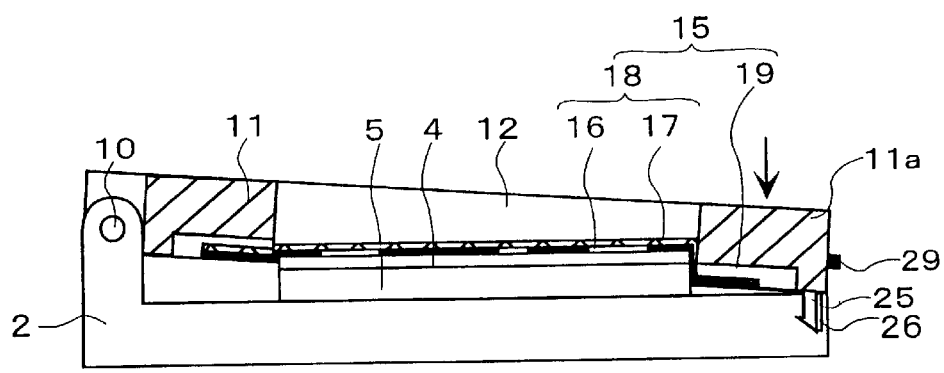
FIG. 5(b) is a side sectional view showing a state in pressing when the fixing means is provided to the simplified type screen printing machine according to the first embodiment.
Figure 5C:
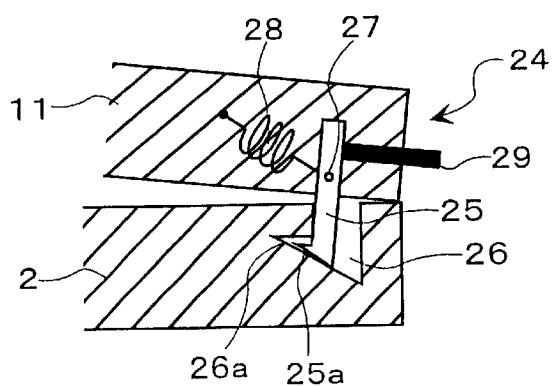
FIG. 5(c) is a side sectional view partially enlarging the fixing means.

Further, as shown by FIGS. 5(a), 5(b) and 5(c), a pivotal end 11a of the press plate 11 according to the embodiment may be provided with engaging means 24 for engaging with the base member 2 and may be engaged with an engaging hole 26 provided at a corresponding position of the base member 2. The engaging means 24 is constituted by an engaging piece 25 engaging with the engaging hole 26, a shaft 27 axially supporting pivotably the engaging piece 25, a spring member 28 for urging the engaging piece 25 to a notched side and a release piece 29 connected to the engaging piece 25.

In this case, as shown by FIGS. 5(b) and 5(c), when the press plate 11 is pivoted to the side of the print base 5 and the framed stencil sheet assembly 15 is fixed by the predetermined tension, the engaging piece 25 is engaged with the engaging hole 26 of the base member 2. Thereby, the tension of the framed stencil sheet assembly 15 can be made always constant. Particularly, in perforating operation, further distinct perforated image can be provided and in printing operation, further distinct image can be provided. Further, when releasing, by depressing the release piece 29, the engaging piece 25 is pivoted on the shaft 27 and a notched portion 25a of the engaging piece 25 is separated from a notched hole 26a of the engaging hole 26.

Next, an explanation will be given of a simplified type screen printing machine 30 according to a second embodiment of the present invention. As shown by FIG. 6, a simplified screen printing machine 30 according to the embodiment is an example in which a base member 32 and a press plate 31 are constituted as separate members. The base member 32 is built with a power source, not illustrated, and the power source is conducted to the light irradiating apparatus 47 mounted to the opening portion 12 of the press plate 31 by being brought into contact with an end edge of the press plate 31. Further, portions the same as those in the first embodiment are attached with the same numerals and an explanation thereof will be omitted.

Figure 7A:
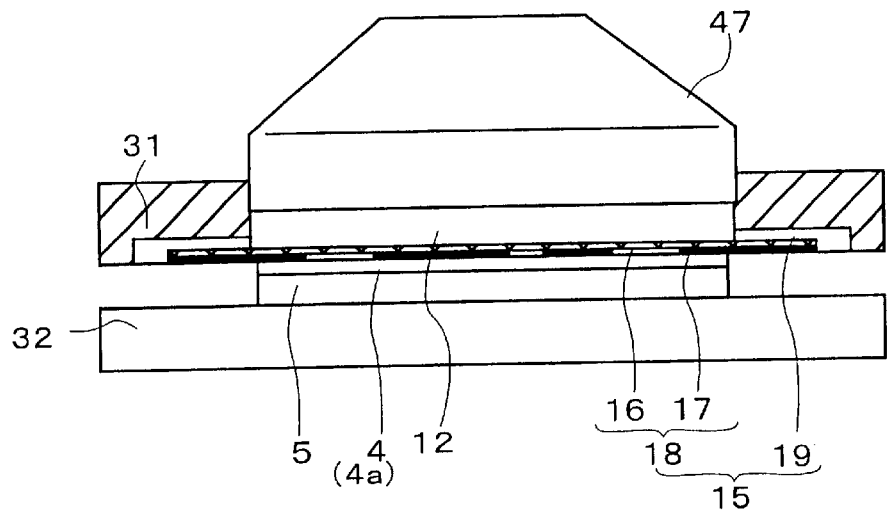
FIG. 7(a) is a side sectional view showing a state before pressing in a perforating stage of the simplified type screen printing machine according to the second embodiment.

Operation of the embodiment is as follows. In perforating operation, as shown by FIG. 7(a), firstly, the light irradiating apparatus 47 is mounted to the opening portion 12 of the press plate 31. The framed stencil sheet assembly 15 is fitted to the holding members 13 of the press plate 31. Further, the original 4a is mounted on the pad 7. The press plate 31 is pivoted toward the print base 5 and the framed stencil sheet assembly 15 is brought into face contact with the surface of the original 4a on the pad 7.

Figure 7B:
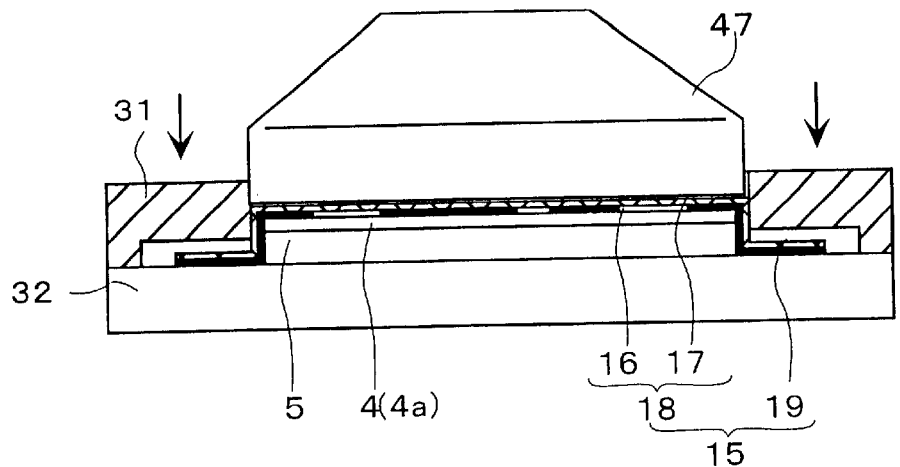
FIG. 7(b) is a side sectional view showing a state in pressing in the perforating stage of the simplified type screen printing machine according to the second embodiment.

Further, when the press plate 31 is pressed as shown by FIG. 7(b), the framed stencil sheet assembly 15 is pressed by the print base 5 from the side with which the an original 4a is brought into face contact and is fixed by predetermined tension.

Further, a pivotal end of the press plate 31 and the base member 32 are brought into contact with each other, electricity is conducted to the light irradiating apparatus 47 and light is irradiated to the stencil sheet 18 of the framed stencil sheet assembly 15 which is fixed with tension. Desired perforated image in accordance with an original image is formed at the stencil sheet 18.

Figure 8A:
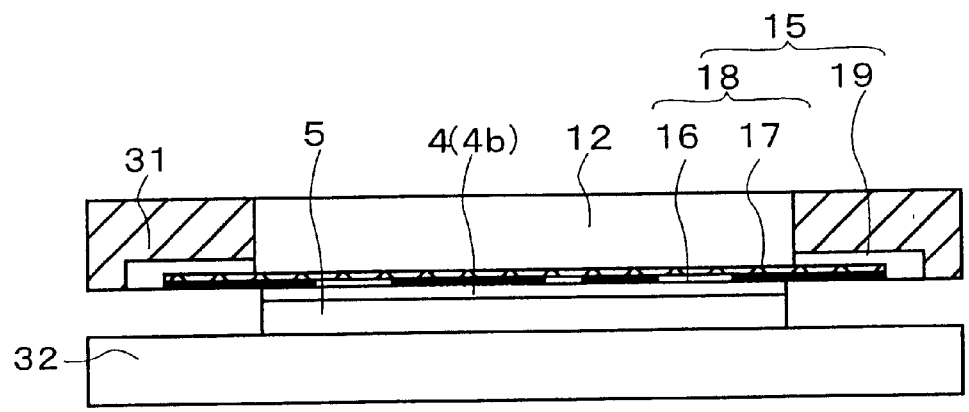
FIG. 8(a) is a side sectional view showing a state before pressing in a printing stage of the simplified type screen printing machine according to the second embodiment.

In printing operation, the light irradiating apparatus 47 is firstly removed. Further, as shown by FIG. 8(a), the printing paper 4b is mounted on the print base 5. Further, the framed stencil sheet assembly 15 is brought into face contact with the surface of the printing paper 4b on the print base 5.

Figure 8B:
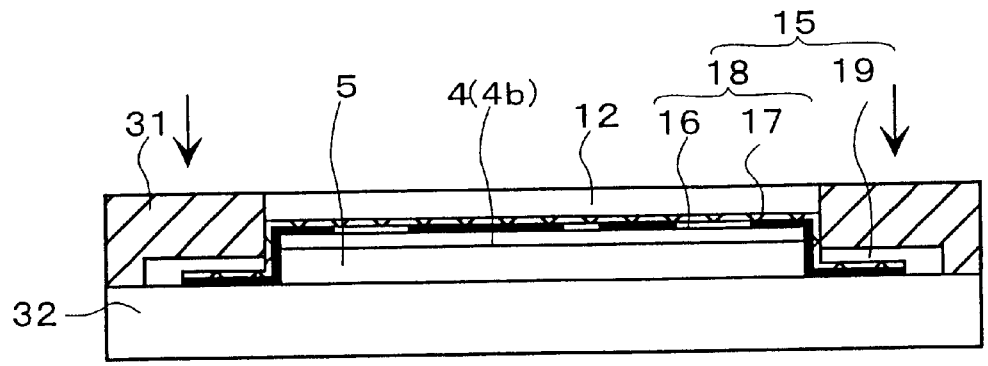
FIG. 8(b) is a side sectional view showing a state in pressing in the printing stage of the simplified type screen printing machine according to the second embodiment.

Thereafter, when the press plate 31 is pressed as shown by FIG. 8(b), the framed stencil sheet assembly 15 is pressed by the print base 5 from a side with which the printing paper 4b is brought into face contact and is fixed by predetermined tension.

Figure 8C:
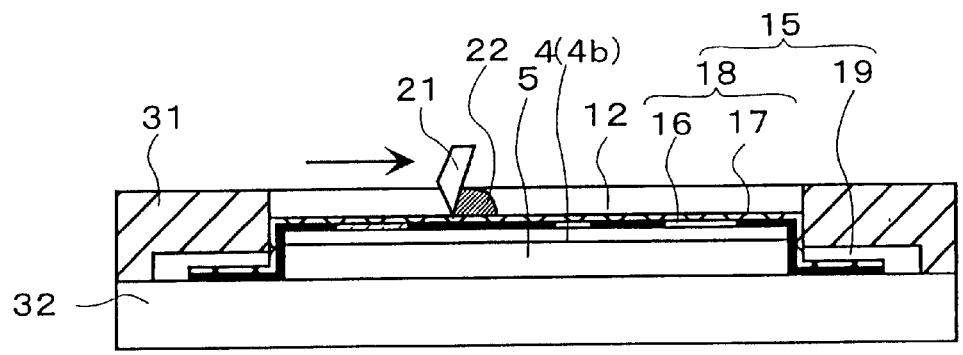
FIG. 8(c) is a side sectional view showing a state in squeegeeing in the printing stage of the simplified type screen printing machine according to the second embodiment.
Figure 8D:
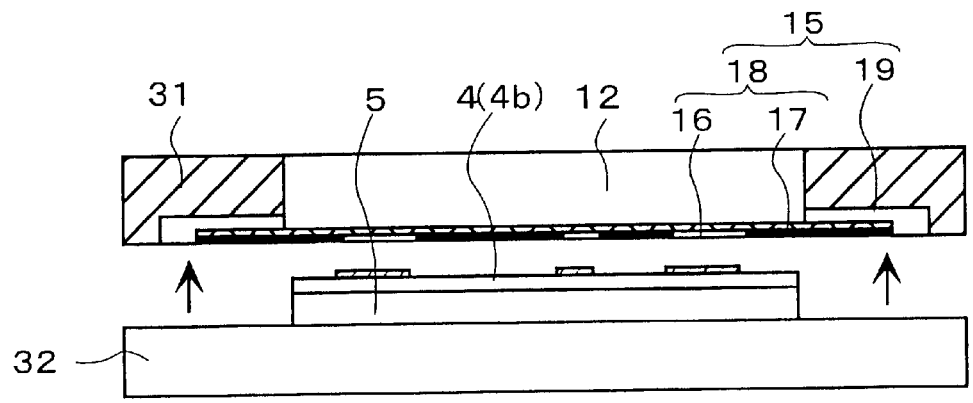
FIG. 8(d) is a side sectional view showing a state of taking out an object to be printed in the printing stage of the simplified type screen printing machine according to the second embodiment.

Under the state, as shown by FIG. 8(c), by the squeegee 21 constituting image forming means, the framed stencil sheet assembly 15 is squeegeed from the side of the porous support 17. The screen printing ink 22 constituting image forming material passes from the porous support 17 to the side of the resin film 16 and is printed on the printed face of the printing paper 4b. Further, as shown by FIG. 8(d), the press plate 31 is pushed up and the printing paper 4b which has been printed is taken out.

Therefore, according to the simplified type screen printing machine 30 constituted in this way, there can be achieved operation and effect similar to those in the above-described first embodiment.

Figure 9A:
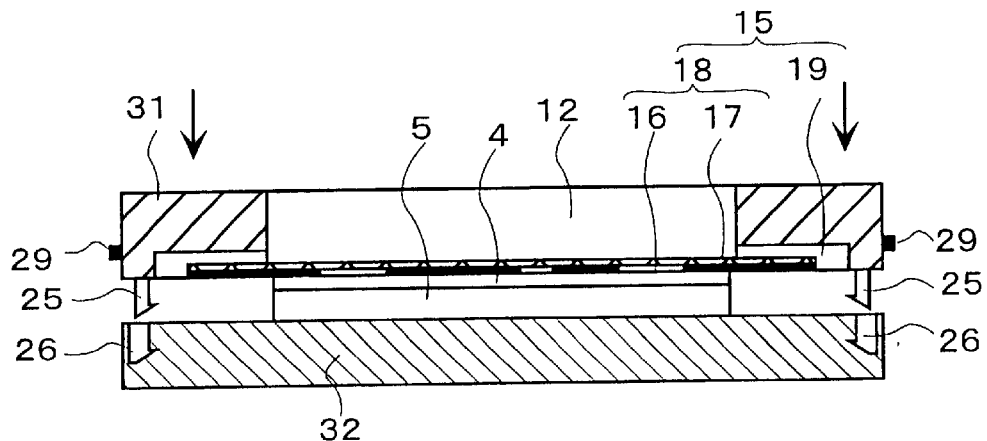
FIG. 9(a) is a side sectional view showing a state before pressing when fixing means is provided to the simplified type screen printing machine according to the second embodiment.
Figure 9B:
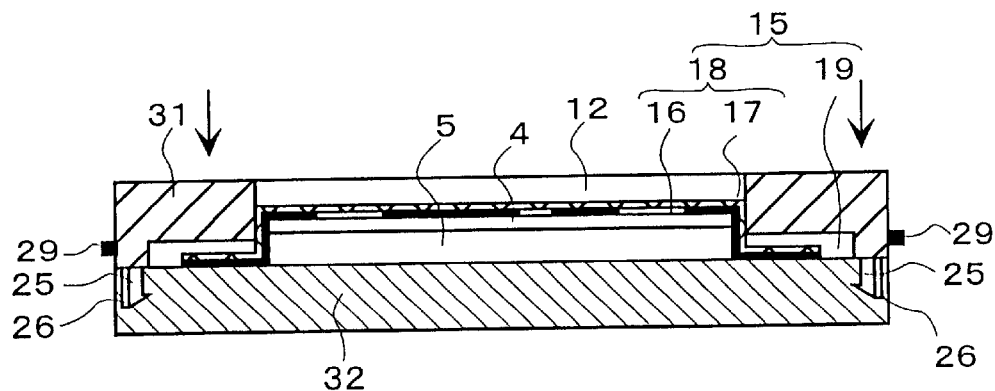
FIG. 9(b) is a side sectional view showing a state in pressing when the fixing means is provided to the simplified type screen printing machine according to the second embodiment.
Figure 9C:
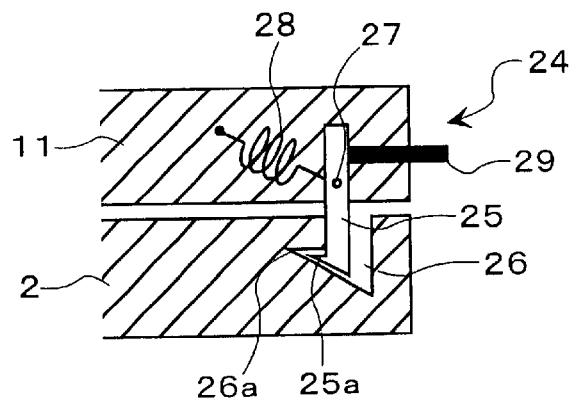
FIG. 9(c) is a side sectional view partially enlarging the fixing means.

Further, as shown by FIGS. 9(a), 9(b) and 9(c), the engaging means 24 explained in the first embodiment may be provided at least two opposed end edges of the press plate 31 and may be engaged with the engaging holes 26. Thereby, the tension of the framed stencil sheet assembly 15 can be made always constant. Particularly, in perforating operation, further distinct perforated image can be provided and in printing operation, further distinct image can be provided.

Further, in the above-described first embodiment, the press plate 11 having the opening portion 12 and a press plate 41 with transparent plate provided with a glass plate 43 as transparent plate at the opening portion 42 as shown by FIG. 10, may interchangeably be constituted and screen printing and plane press type printing for planely pressing the stencil sheet of the framed stencil sheet assembly 44, may be carried out by a single printing machine.

Figure 11:
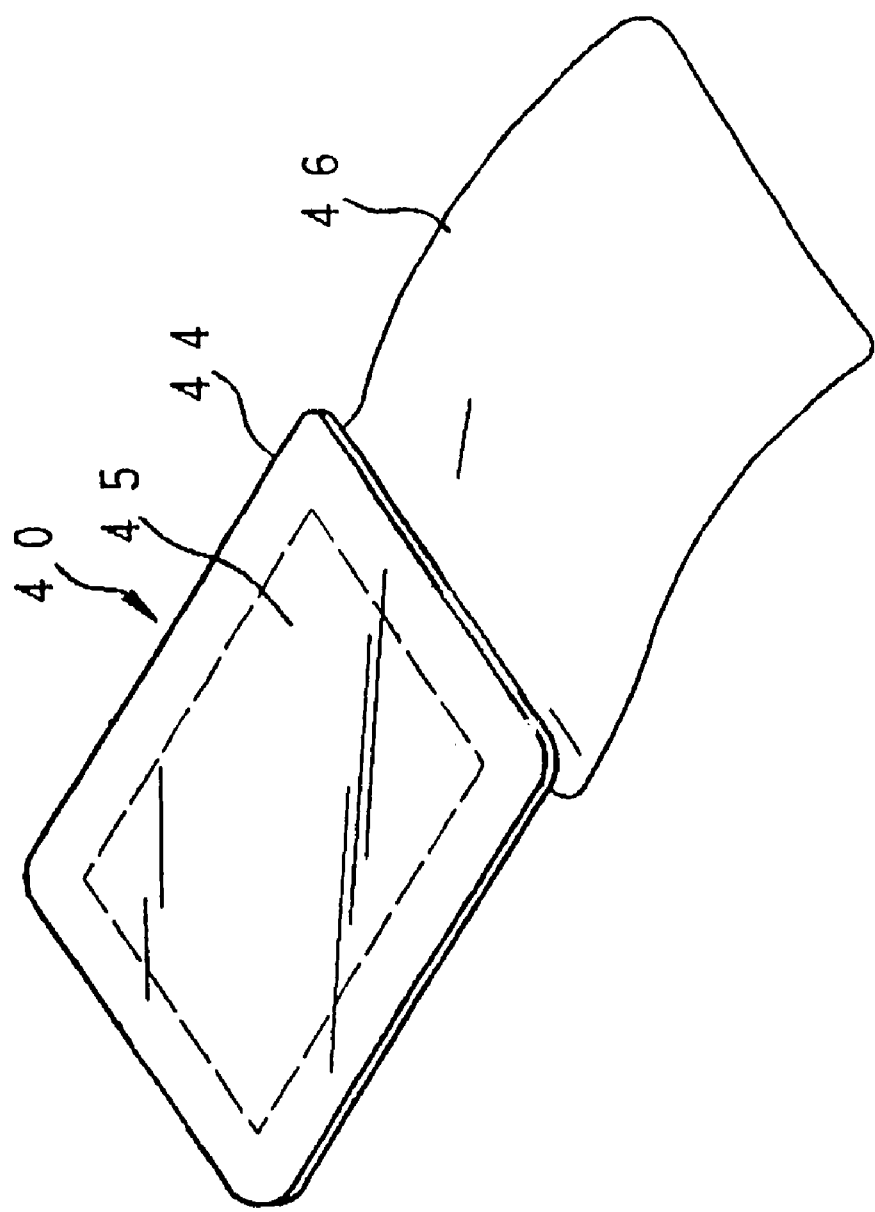
FIG. 11 is a view showing a framed stencil sheet assembly used in the simplified type screen printing machine provided with the press plate having the transparent plate.
Figure 12A:
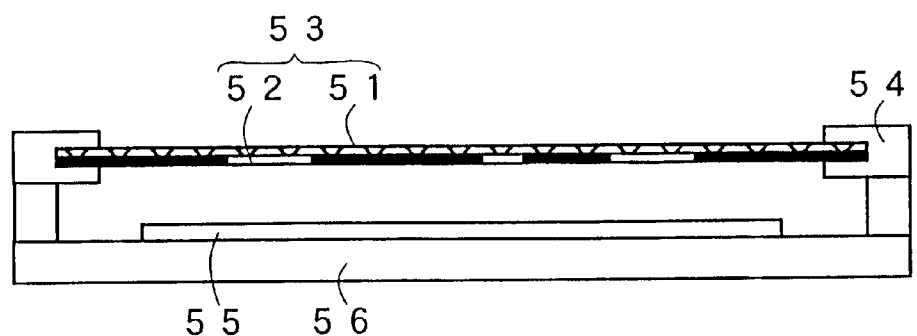
FIG. 12(a) is an outline view showing a state before squeegeeing of a conventional screen printing machine.
Figure 12B:
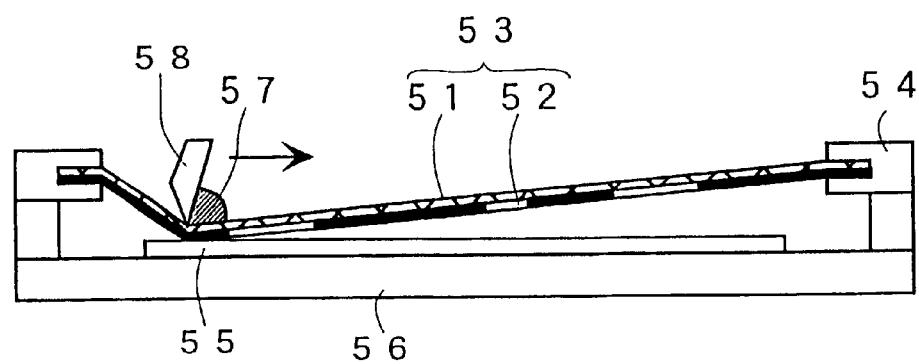
FIG. 12(b) is an outline view showing the state in starting to squeegee of the conventional screen printing machine.
Figure 12C:
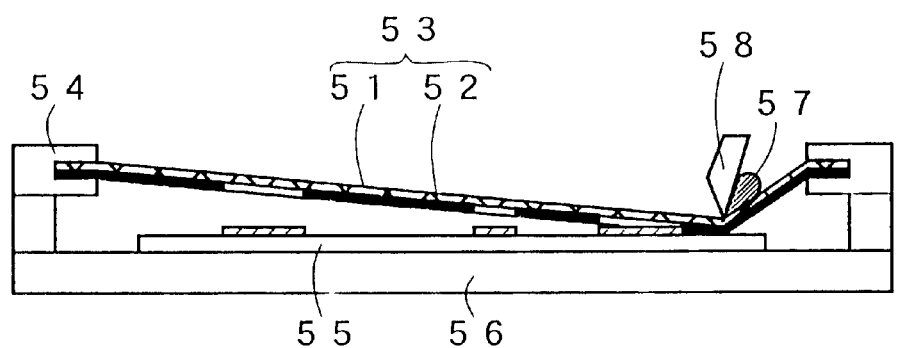
FIG. 12(c) is an outline view showing a state in finishing to squeegee of the conventional screen printing machine.
Figure 12D:
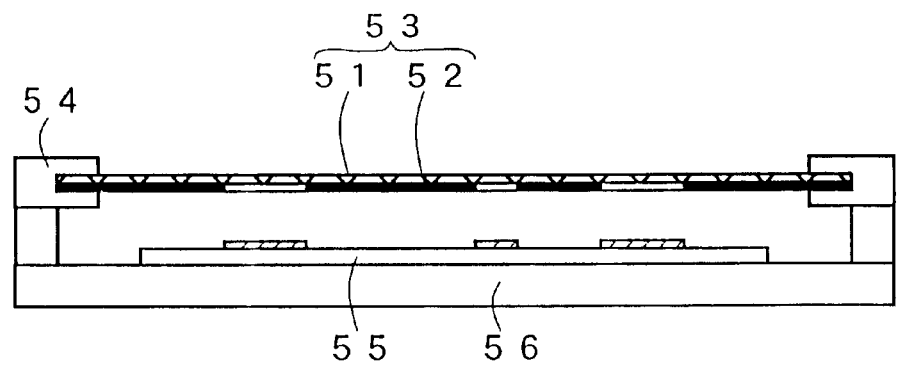
FIG. 12(d) is an outline view showing a state after finishing to print of the conventional screen printing machine.

In this case, as shown by FIG. 11, a framed stencil sheet assembly 40 is provided with a frame member 44 substantially in a rectangular shape having predetermined thickness and rigidity. One face of the frame member 44 is laminated with stencil sheet 45 before perforating. The stencil sheet 45 is heat-sensitive stencil sheet constituted by laminating together a thermoplastic resin film and a porous support. Further, other face of the frame member 44 is fixed with an ink-unpermeable back sheet 46. The back sheet 46 is constituted by an outer shape substantially the same as that of the frame member 44. According to the back sheet 46, one short edge side thereof is fixed to corresponding one short edge side of the frame member 44.

According thereto, in the case of changing from the screen printing to the plane press type printing, the press plate 11 is interchanged by the press plate 41 having the transparent plate provided with the glass plate 43 at the opening portion 42. In perforating operation, the light irradiating apparatus 47 is mounted to the opening portion 42, the original 4a is mounted on the print base 5 and the stencil sheet assembly 40 is mounted to a lower face of the glass plate 43. Further, when the press plate 41 is pressed to the direction of the print base 5, the heat-sensitive stencil sheet 45 is brought into close contact with the original 4a and at the same time, the light irradiating apparatus 47 is operated by closing a switch mechanism, not illustrated. The flash bulbs 49 emit flash which passes through the transparent plate 43 and the heat-sensitive stencil sheet 45 and makes image of the original 4a generate heat. Perforated image in correspondence with image of the original 4a is formed at the resin film of the heat-sensitive stencil sheet 45.

Thereafter, the back sheet 46 of the framed stencil sheet assembly 40 which has been perforated is opened, ink is mounted on the porous support and the back sheet 46 is closed again. Further, the framed stencil sheet assembly 40 which has been perforated is mounted to the press plate 41 having transparent plate with the heat-sensitive stencil sheet 45 directed downwardly. When the print sheet 4b is mounted on the print base 5 and the press plate 41 having transparent plate is pressed to the side of the print base 5, the heat-sensitive stencil sheet 45 is pressed to the print sheet 4b and stencil printing is carried out to the print sheet 4b.

Further, although in FIG. 10, there is shown the simplified type screen printing machine according to the first embodiment, the same is applied to the simplified screen printing machine according to the second embodiment.

As has been explained, according to the simplified type screen printing machine of the present invention, the predetermined tension can be exerted to the framed stencil sheet assembly over the entire face of the object to be pressed by pressing the framed stencil sheet assembly to the base member to be brought into contact with the object to be pressed and stretching and fixing the stencil sheet assembly.

Further, image having a uniform distinctness can be formed over the entire face of the object to be printed constituting the object to be pressed by making the image forming material pass through the framed stencil sheet assembly by the image forming means under the state of exerting the predetermined tension to the framed stencil sheet assembly even when pressure applied on the framed stencil sheet assembly by the image forming means is not uniform.

Further, perforated image having a uniform distinctness can be formed by uniformly irradiating light over the entire face of an original constituting the object to be pressed by attachably and detachably providing the light irradiating apparatus for irradiating light to the stencil sheet in the state of exerting the predetermined tension to the framed stencil sheet assembly.

Further, the tension of the framed stencil sheet assembly can be made always constant by fixing the pressing means relievably to the base member in the state in which the framed stencil sheet assembly is fixed to the object to be printed on the base member by the predetermined tension. Particularly, in perforating operation, further distinct perforated image can be provided and in printing operation, further distinct image can be provided.

Further, the screen printing and the plane press type printing can be carried out by a single printing machine by interchangeably constituting the pressing means and the pressing means having transparent plate provided with the transparent plate at the opening portion.

What is claimed is:

1. A simplified screen printing machine comprising:

a base member having a print base with an elastic member for mounting an object to be pressed;

a framed stencil sheet assembly at least constituted by a stencil sheet comprising a porous support and a resin film laminated to the support and a frame member laminated with the stencil sheet; and pressing means attachably and detachably assembled with the framed stencil sheet assembly for pressing the framed stencil sheet assembly to the base member, said pressing means having an opening for receiving at least a part of the print base therein so that when the pressing means assembled with the stencil sheet assembly is disposed on the print base with the object to be pressed thereon, the print base with the object to be pressed is at least partly located in the opening to thereby stretch the framed stencil sheet assembly with tension.

2. The simplified screen printing machine according to claim 1, further comprising image forming means for making an image forming material pass through the framed stencil sheet assembly which is fixed with tension.

3. The simplified screen printing machine according to claim 1, further comprising a light irradiating apparatus attachably and detachably mounted to the pressing means for irradiating light to the stencil sheet of the framed stencil sheet assembly which is fixed with tension.

4. The simplified screen printing machine according to claim 1, wherein the pressing means is openably-closably and pivotally supported by the base member, and attachably and detachably assembled with the framed stencil sheet assembly.

5. The simplified screen printing machine according to claim 1, wherein the pressing means is provided to the base member as a separate member.

6. The simplified screen printing machine according to claim 1, further comprising engaging means for relievably fixing the pressing means to the base member by a predetermined tension.

7. The simplified screen printing machine according to claim 1, wherein the pressing means can be interchanged with another pressing means having a transparent plate provided with the transparent plate at the opening; and the framed stencil sheet assembly is laminated with an ink-unpermeable back sheet pasted at the frame member.

8. The simplified screen printing machine according to claim 1, wherein said base member includes two bearings, and said frame member includes two pivot shafts disposed in the two bearings so that the frame member is pivotally supported on the base member.

* * * * *